(12) United States Patent
Gangakhedkar et al.

(10) Patent No.: US 10,766,824 B2
(45) Date of Patent: Sep. 8, 2020

(54) METHODS OF MINIMIZING PARTICLES ON WAFER FROM PLASMA SPRAY COATINGS

(71) Applicant: APPLIED Materials, Inc., Santa Clara, CA (US)

(72) Inventors: Kaushal Gangakhedkar, San Jose, CA (US); Jennifer Y. Sun, Mountain View, CA (US); Xiao-Ming He, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 21 days.

(21) Appl. No.: 15/807,508

(22) Filed: Nov. 8, 2017

(65) Prior Publication Data

US 2019/0135704 A1 May 9, 2019

(51) Int. Cl.
| | |
|---|---|
| *C04B 35/64* | (2006.01) |
| *H01J 37/32* | (2006.01) |
| *C04B 35/622* | (2006.01) |
| *C04B 41/50* | (2006.01) |
| *C04B 41/00* | (2006.01) |
| *C04B 41/87* | (2006.01) |

(Continued)

(52) U.S. Cl.
CPC .............. *C04B 35/64* (2013.01); *C04B 35/50* (2013.01); *C04B 35/505* (2013.01); *C04B 35/62222* (2013.01); *C04B 41/009* (2013.01); *C04B 41/5031* (2013.01); *C04B 41/5032* (2013.01); *C04B 41/5042* (2013.01); *C04B 41/5045* (2013.01); *C04B 41/5055* (2013.01); *C04B 41/87* (2013.01); *H01J 37/32467* (2013.01); *H01J 37/32495* (2013.01); *C04B 2235/3217* (2013.01); *C04B 2235/3222* (2013.01); *C04B 2235/3224* (2013.01); *C04B 2235/3225* (2013.01); *C04B 2235/3244* (2013.01); *C04B 2235/3246* (2013.01); *C04B 2235/3418* (2013.01); *C04B 2235/445* (2013.01); *C04B 2235/6562* (2013.01); *C04B 2235/6565* (2013.01); *C04B 2235/6567* (2013.01)

(58) Field of Classification Search
CPC ... C04B 35/64; C04B 35/62222; C04B 41/87; C04B 41/009; C04B 2235/6565; C04B 2235/6562; C04B 2235/6567; H01J 37/32495; H01J 37/32467
See application file for complete search history.

(56) References Cited

U.S. PATENT DOCUMENTS 8,067,067 B2 * 11/2011 Sun ..................... C23C 16/4404
118/715
9,212,099 B2 * 12/2015 Sun ..................... C04B 41/0072
(Continued)

*Primary Examiner* — Noah S Wiese
(74) *Attorney, Agent, or Firm* — Lowenstein Sandler LLP

(57) ABSTRACT

Methods comprise performing two or more thermal cycles on an article comprising a body and a ceramic coating. Each thermal cycle of the two or more thermal cycles comprise heating the ceramic article to a target temperature at a first ramping rate. Each thermal cycle further comprises maintaining the article at the target temperature for a first duration of time and then cooling the article to a second target temperature at a second ramping rate. The method further comprises submerging the article in a bath for a second duration of time to remove the particles from the ceramic coating.

20 Claims, 5 Drawing Sheets

(51) Int. Cl.
    *C04B 35/505*      (2006.01)
    *C04B 35/50*       (2006.01)

(56) References Cited

U.S. PATENT DOCUMENTS

2008/0213496 A1\*  9/2008  Sun .......................... C23C 4/18
                                                     427/453
2013/0273313 A1\*  10/2013 Sun ........................ C03C 17/23
                                                     428/137
2013/0284373 A1\*  10/2013 Sun .......................... C23F 1/08
                                                     156/345.34

\* cited by examiner

Liquid Particle Count Table 400

|  | Pre-Clean | | Post-Clean | | 821 Percentage Decrease | 822 Percentage Decrease |
| --- | --- | --- | --- | --- | --- | --- |
| Sample # | 821 | 822 | 821 | 822 | | |
| Liquid Particle Count | | | | | | |
| ≥ 0.2 μm | 3,600,000 | 5,200,000 | 110,000 | 7,500 | 96.94% | 99.86% |
| ≥ 0.3 μm | 1,700,000 | 2,700,000 | 50,000 | 3,200 | 97.06% | 99.88% |
| ≥ 0.5 μm | 1,100,000 | 1,700,000 | 24,000 | 1,300 | 97.82% | 99.92% |
| ≥ 1.0 μm | 680,000 | 980,000 | 12,000 | 550 | 98.24% | 99.94% |
| ≥ 2.0 μm | 18,000 | 12,000 | 960 | <100 | 94.67% | 99.17% |

Legend 405

| Sample # |
| --- |
| 821 = DI water bath + Ultrasonication |
| 822 = Thermal cycle + DI water bath + Ultrasonication |

FIG. 4

METHODS OF MINIMIZING PARTICLES ON WAFER FROM PLASMA SPRAY COATINGS

TECHNICAL FIELD

Embodiments relate, in general, to minimizing particle contamination on wafers from particles shed by plasma sprayed coatings.

BACKGROUND

In the semiconductor industry, devices are fabricated by a number of manufacturing processes producing structures of an ever-decreasing size. Some manufacturing processes such as plasma etch and plasma clean processes expose a substrate to a high-speed stream of plasma to etch or clean the substrate. The plasma may be highly corrosive, and may corrode processing chambers and other surfaces that are exposed to the plasma. This corrosion may generate particles, which frequently contaminate the substrate that is being processed, contributing to device defects.

As device geometries shrink, susceptibility to defects increases and particle contaminant thresholds become more stringent. Accordingly, as device geometries shrink, allowable levels of particle contamination may be reduced. To minimize particle contamination introduced by plasma etch and/or plasma clean processes, chamber materials have been developed that are resistant to plasmas. Typically, chamber components are coated with plasma resistant coatings using plasma spray processes. The plasma sprayed coatings have a porosity of about 2-7% and many micro-cracks. Additionally, the plasma sprayed coatings generally have a high surface roughness of about 200-250 µ-inch, which may cause loose particles to get trapped in crevices of the plasma resistant coating. As a result, the plasma sprayed coatings often shed particles after plasma bombardment, which can reduce yield of manufactured devices.

SUMMARY

In an embodiment, a method comprises performing two or more thermal cycles on an article comprising a body and a ceramic coating on at least one surface of the body, wherein the two or more thermal cycles expand and contract the ceramic coating to weaken bonds of particles to the ceramic coating. Each thermal cycle of the two or more thermal cycles comprise heating the article to a target temperature of about 100° C. to about 150° C. at a first ramping rate. Each thermal cycle further comprises maintaining the article at the target temperature for a first duration of time and then cooling the article to a second target temperature at a second ramping rate. The method further comprises submerging the article in a bath for a second duration of time to remove the particles from the ceramic coating.

BRIEF DESCRIPTION OF THE DRAWINGS

Embodiments are illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 4 depicts a sample table of advantages of performing multiple thermal cycles to loosen particles from the ceramic coating prior to cleaning an article.

DETAILED DESCRIPTION OF EMBODIMENTS

Figure 1:
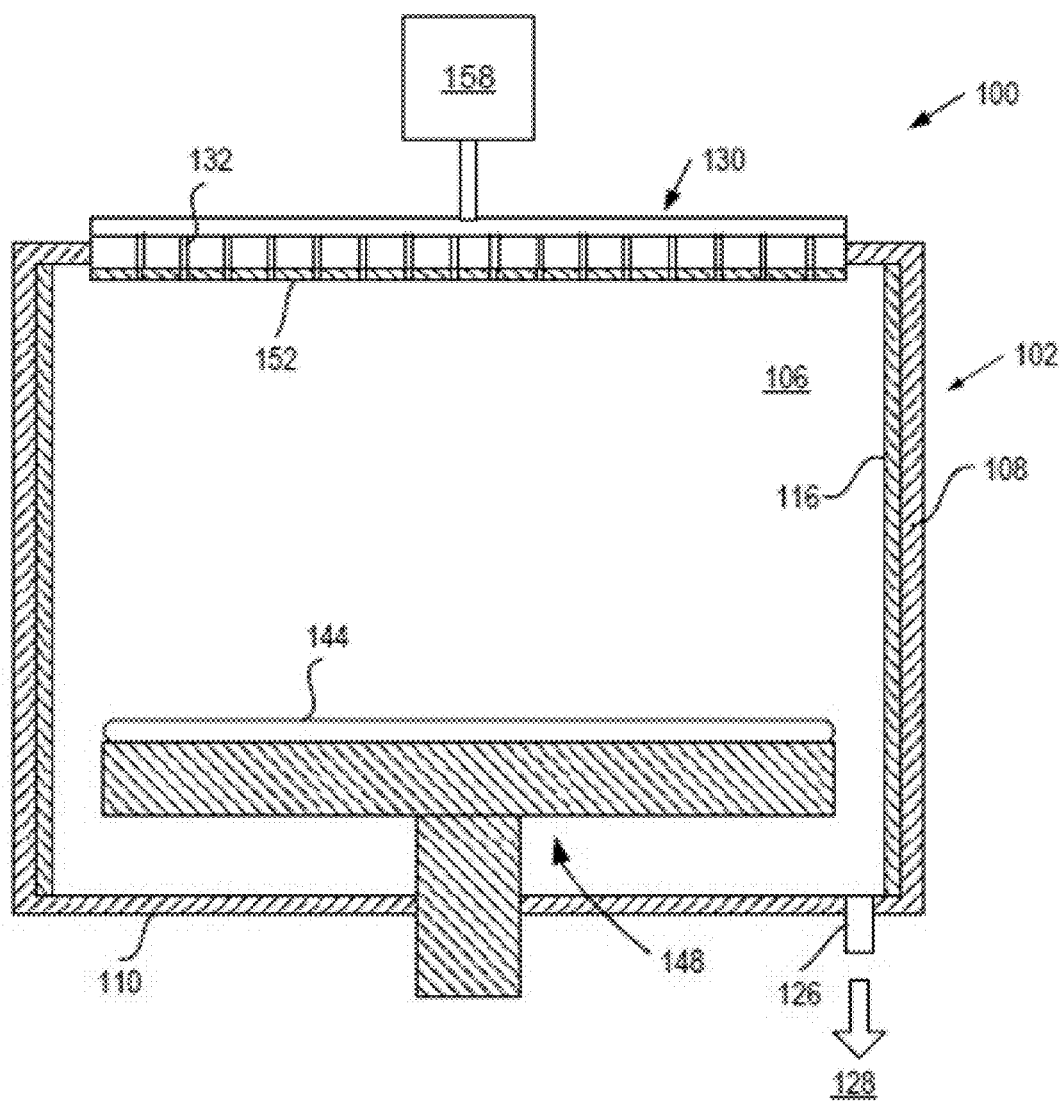
FIG. 1 depicts a sectional view of one embodiment of a processing chamber.

Embodiments are directed to a process for heat treating and cleaning an article having a ceramic coating using a thermal cycling and cleaning treatment process, and to an article with a ceramic coating that has been processed using the thermal cycling and cleaning treatment. In an embodiment, an article including a body and a ceramic coating having an initial porosity, an initial bond strength to the article, an initial amount of cracking, and an initial surface roughness is provided. The body of the article may be a metal body or a sintered ceramic body, and the ceramic coating may have been deposited by a plasma spray deposition process. The article may be, for example, a lid, nozzle, showerhead, gas distribution plate, electrostatic chuck, or other chamber component for a processing chamber.

Traditional heat treatment processes heat treat the article by heating the article a single time to a specific temperature for a period of time in order to strengthen the bonds of particles to the ceramic coating and to strengthen bonds between particles within the ceramic coating. After heat treatment, the article is cleaned in a water bath to remove any loose particles from the ceramic coating of the article. However, in many cases partially bonded particles may remain on the ceramic coating. These partially bonded particles may, during etch processing and other processing that uses a corrosive plasma environment, break loose and contaminate the chamber including a wafer within the chamber. In order to prevent particle contamination (e.g., to reduce a number of particle adders), traditional etch processing preparation includes a seasoning process of the article. The seasoning process includes exposing the article to conditions similar to the etch process for a certain number of hours in order to ensure that the ceramic coating of the article, during processing, does not shed excess particles that may cause contamination of wafers. The seasoning process may include several simulation cycles using the etch chamber and test wafers. The seasoning process may take several hours and may involve using multiple test wafers.

Embodiments provide an improved technique that includes a thermal cycle process to reduce particle contamination caused by particles shed from plasma sprayed coatings. The thermal cycle process provides a number of unexpected advantages over other types of heat treatment and over typical seasoning processes. Advantages to performing the thermal cycling process described in some embodiments may reduce the number of seasoning cycles and the number of test wafers used for preparing the article for use. The thermal cycling process may emulate the seasoning process of the article within a furnace, or other heating chamber, in less time and without the use of test wafers. Additionally, the thermal cycle process described herein, when paired with a subsequent cleaning process, significantly reduces an amount of particle contamination on processed substrates.

In an embodiment, the thermal cycling process may include two or more thermal cycles that include heating the article to a target temperature similar to the target temperature used during processing at a ramping rate. The target temperature may be, for example, around 120-180° C. (e.g., 150° C.), and the ramping rate may be, for example, between 1° C. and 10° C. per minute. Once the target temperature is reached, the article maintains the target temperature for a specific duration of time. Maintaining the target temperature causes the particles, article and ceramic coating to expand. The expansion of the particles, article and ceramic coating further causes bonds between bonded particles and the plasma sprayed coating to extend and stretch. After maintaining the target temperature for the specific duration of time, the article is cooled to a second target temperature at a second ramping rate, which causes the expanded particles, plasma sprayed coating and article to contract and further causes the bonds to shorten. The second target temperature may be, for example, 20-60° C. (e.g., around room temperature) and the second ramping (cooling) down rate may be, for example, 2-10° C. per minutes. Thermal cycling may then be repeated multiple times in order to heat and cool the article, which causes the bonds of partially or weakly bonded particles to further weaken and break by repeated expanding & contracting.

During a subsequent cleaning process, the particles that were previously partially or weakly bonded are removed. The thermal cycling process therefore reduces the seasoning times by removing the partially or weakly bonded particles before performing the seasoning process. As a result, the article may be ready for etch process after a minimal number of seasoning cycles in plasma chamber.

The term "heat treating" is used herein to mean applying an elevated temperature to an article, such as by heating the article in a furnace. When the term "about" is used herein, this is intended to mean that the nominal value presented is precise within ±10%.

Note that some embodiments are described herein with reference to particular chamber components used, for example, in processing chambers (e.g., of plasma etchers) for semiconductor manufacturing. However, it should be understood that such processing chambers may also be used to manufacture micro-electro-mechanical systems (MEMS)) devices. Additionally, the heat treated articles described herein may be other structures that are exposed to plasma. For example, the articles may be ceramic coated rings, walls, bases, gas distribution plates, shower heads, substrate holding frames, etc. of a plasma etcher, a plasma cleaner, a plasma propulsion system, an atomic layer deposition (ALD) chamber, and so forth. Moreover, embodiments are described herein with reference to articles with heat treated ceramic coatings that cause reduced particle contamination when used in a process chamber for plasma rich processes. However, it should be understood that the articles discussed herein may also provide reduced particle contamination when used in process chambers for other processes such as non-plasma etchers, non-plasma cleaners, chemical vapor deposition (CVD) chambers, physical vapor deposition (PVD) chambers, plasma enhanced chemical vapor deposition (PECVD) chambers, plasma enhanced physical vapor deposition (PEPVD) chambers, plasma enhanced atomic layer deposition (PEALD) chambers, and so forth.

FIG. 1 is a sectional view of a semiconductor processing chamber 100 having one or more chamber components that are coated with a heat treated ceramic coating in accordance with embodiments. The processing chamber 100 may be used for processes in which a corrosive plasma environment having plasma processing conditions is provided. For example, the processing chamber 100 may be a chamber for a plasma etcher or plasma etch reactor, a plasma cleaner, plasma enhanced CVD or ALD reactors and so forth. The heat treated ceramic coating, which is described in greater detail below, is heat treated using multiple thermal cycles.

In an embodiment one or more articles in the process chamber 100 may be composed of or include aluminum, an aluminum alloy (e.g., Al 6061, Al 6063, etc.), stainless steel, or any other metal compound. In an embodiment, articles may be composed of or include a solid sintered ceramic body such as $Y_2O_3$, $Al_2O_3$, AlN, and $Y_3Al_5O_{12}$ (YAG).

One or more of the articles in the process chamber 100 include a plasma sprayed ceramic coating that has been heat treated in accordance with embodiments (e.g., using multiple thermal cycles). The plasma sprayed ceramic coating may be a plasma resistant ceramic coating. The plasma sprayed ceramic coating may include or consist of $Y_2O_3$, $Al_2O_3$, $Er_2O_3$, $YF_3$, $Y_3Al_5O_{12}$ (YAG), $Er_3Al_5O_{12}$ (EAG), Y—O—F (e.g., $Y_5O_4F_7$), $Er_3Al_5O_{12}$ (EAG), $Y_4Al_2O_9$ (YAM), $YAlO_3$ (YAP), $Er_4Al_2O_9$ (EAM), $ErAlO_3$ (EAP), Y—O—F (e.g., $Y_5O_4F_7$), a solid solution of $Y_2O_3$—$ZrO_2$, or a ceramic compound comprising $Y_4Al_2O_9$ and a solid-solution of $Y_2O_3$—$ZrO_2$.

With reference to the solid-solution of $Y_2O_3$—$ZrO_2$, the plasma sprayed ceramic coating may include $Y_2O_3$ at a concentration of 10-90 molar ratio (mol %) and $ZrO_2$ at a concentration of 10-90 mol %. In some examples, the solid-solution of $Y_2O_3$—$ZrO_2$ may include 10-20 mol % $Y_2O_3$ and 80-90 mol % $ZrO_2$, may include 20-30 mol % $Y_2O_3$ and 70-80 mol % $ZrO_2$, may include 30-40 mol % $Y_2O_3$ and 60-70 mol % $ZrO_2$, may include 40-50 mol % $Y_2O_3$ and 50-60 mol % $ZrO_2$, may include 60-70 mol % $Y_2O_3$ and 30-40 mol % $ZrO_2$, may include 70-80 mol % $Y_2O_3$ and 20-30 mol % $ZrO_2$, may include 80-90 mol % $Y_2O_3$ and 10-20 mol % $ZrO_2$, and so on.

With reference to the ceramic compound comprising $Y_4Al_2O_9$ and a solid-solution of $Y_2O_3$—$ZrO_2$, in one embodiment the ceramic compound includes 62.93 molar ratio (mol %) $Y_2O_3$, 23.23 mol % $ZrO_2$ and 13.94 mol % $Al_2O_3$. In another embodiment, the ceramic compound can include $Y_2O_3$ in a range of 50-75 mol %, $ZrO_2$ in a range of 10-30 mol % and $Al_2O_3$ in a range of 10-30 mol %. In another embodiment, the ceramic compound can include $Y_2O_3$ in a range of 40-100 mol %, $ZrO_2$ in a range of 0.1-60 mol % and $Al_2O_3$ in a range of 0.1-10 mol %. In another embodiment, the ceramic compound can include $Y_2O_3$ in a range of 40-60 mol %, $ZrO_2$ in a range of 35-50 mol % and $Al_2O_3$ in a range of 10-20 mol %. In another embodiment, the ceramic compound can include $Y_2O_3$ in a range of 40-50 mol %, $ZrO_2$ in a range of 20-40 mol % and $Al_2O_3$ in a range of 20-40 mol %. In another embodiment, the ceramic compound can include $Y_2O_3$ in a range of 80-90 mol %, $ZrO_2$ in a range of 0.1-20 mol % and $Al_2O_3$ in a range of 10-20 mol %. In another embodiment, the ceramic compound can include $Y_2O_3$ in a range of 60-80 mol %, $ZrO_2$ in a range of 0.1-10 mol % and $Al_2O_3$ in a range of 20-40 mol %. In another embodiment, the ceramic compound can include $Y_2O_3$ in a range of 40-60 mol %, $ZrO_2$ in a range of 0.1-20 mol % and $Al_2O_3$ in a range of 30-40 mol %. In other embodiments, other distributions may also be used for the ceramic compound.

In one embodiment, the plasma sprayed ceramic coating includes or consists of an alternative ceramic compound that includes a combination of $Y_2O_3$, $ZrO_2$, $Er_2O_3$, $Gd_2O_3$ and $SiO_2$. In one embodiment, the alternative ceramic compound can include $Y_2O_3$ in a range of 40-45 mol %, $ZrO_2$ in a range of 0-10 mol %, $Er_2O_3$ in a range of 35-40 mol %, $Gd_2O_3$ in a range of 5-10 mol % and $SiO_2$ in a range of 5-15 mol %. In a first example, the alternative ceramic compound includes 40 mol % $Y_2O_3$, 5 mol % $ZrO_2$, 35 mol % $Er_2O_3$, 5 mol % $Gd_2O_3$ and 15 mol % $SiO_2$. In a second example, the alternative ceramic compound includes 45 mol % $Y_2O_3$, 5 mol % $ZrO_2$, 35 mol % $Er_2O_3$, 10 mol % $Gd_2O_3$ and 5 mol % $SiO_2$. In a third example, the alternative ceramic compound includes 40 mol % $Y_2O_3$, 5 mol % $ZrO_2$, 40 mol % $Er_2O_3$, 7 mol % $Gd_2O_3$ and 8 mol % $SiO_2$.

Any of the aforementioned plasma sprayed ceramic coatings may include trace amounts of other materials such as $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides.

The ceramic coating may be plasma sprayed onto at least one surface of the body of one or more articles (e.g., one or more chamber components of the processing chamber 100). The plasma sprayed ceramic coating may have a thickness of about 4 mil (100 µm) to about 10 mil (250 µm). The plasma sprayed ceramic coating may have a plurality of cracks, a porosity of about 2-5%, and a relatively high average surface roughness of about 200-250 µ-inches in embodiments. The plasma sprayed ceramic coating may be a non-conformal coating. If the body of the article is a metal body, then the article may include a native oxide, and the ceramic coating may be deposited over the native oxide. For example, an aluminum body may have a native oxide of $Al_2O_3$. The native oxide may have a thickness of about 5-10 nm in embodiments.

In an embodiment, the processing chamber 100 includes a chamber body 102 and a showerhead 130 that enclose an interior volume 106. The showerhead 130 may include a showerhead base and a showerhead gas distribution plate. Alternatively, the showerhead 130 may be replaced by a lid and a nozzle in some embodiments, or by multiple pie shaped showerhead compartments and plasma generation units in other embodiments. The chamber body 102 may be fabricated from aluminum, stainless steel or other suitable material. The chamber body 102 generally includes sidewalls 108 and a bottom 110.

An outer liner 116 may be disposed adjacent the sidewalls 108 to protect the chamber body 102. In an embodiment, the outer liner 116 is fabricated from aluminum oxide. In an embodiment, the outer liner 116 includes a heat treated ceramic coating.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The showerhead 130 may be supported on the sidewall 108 of the chamber body 102. The showerhead 130 (or lid) may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through the showerhead 130 or lid and nozzle. Showerhead 130 may be used for processing chambers used for dielectric etch (etching of dielectric materials). The showerhead 130 may include a gas distribution plate (GDP) and may have multiple gas delivery holes 132 throughout the GDP. The showerhead 130 may include the GDP bonded to an aluminum base or an anodized aluminum base. The GDP may be made from Si or SiC, or may be a ceramic such as $Y_2O_3$, $Al_2O_3$, $Y_3Al_5O_{12}$ (YAG), and so forth. In some embodiments the showerhead 130 includes a heat treated ceramic coating 152 manufactured in accordance with embodiments described herein.

For processing chambers used for conductor etch (etching of conductive materials), a lid may be used rather than a showerhead. The lid may include a center nozzle that fits into a center hole of the lid. The lid may be a ceramic such as $Al_2O_3$, $Y_2O_3$, YAG, or a ceramic compound comprising $Y_4Al_2O_9$ and a solid-solution of $Y_2O_3$—$ZrO_2$. The nozzle may also be a ceramic, such as $Y_2O_3$, YAG, or the ceramic compound comprising $Y_4Al_2O_9$ and a solid-solution of $Y_2O_3$—$ZrO_2$. The lid and/or nozzle may include a heat treated ceramic coating in embodiments.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases). A substrate support assembly 148 is disposed in the interior volume 106 of the processing chamber 100 below the showerhead 130 or lid. The substrate support assembly 148 holds a substrate 144 during processing. The surface of an electrostatic chuck of the substrate support assembly 148 may include a heat treated ceramic coating in embodiments.

An inner liner may be coated on the periphery of the substrate support assembly 148. The inner liner may be a halogen-containing gas resistant material such as those discussed with reference to the outer liner 116. In an embodiment, the inner liner may be fabricated from the same materials of the outer liner 116. In an embodiment, the inner liner includes a heat treated ceramic coating.

Figure 2:
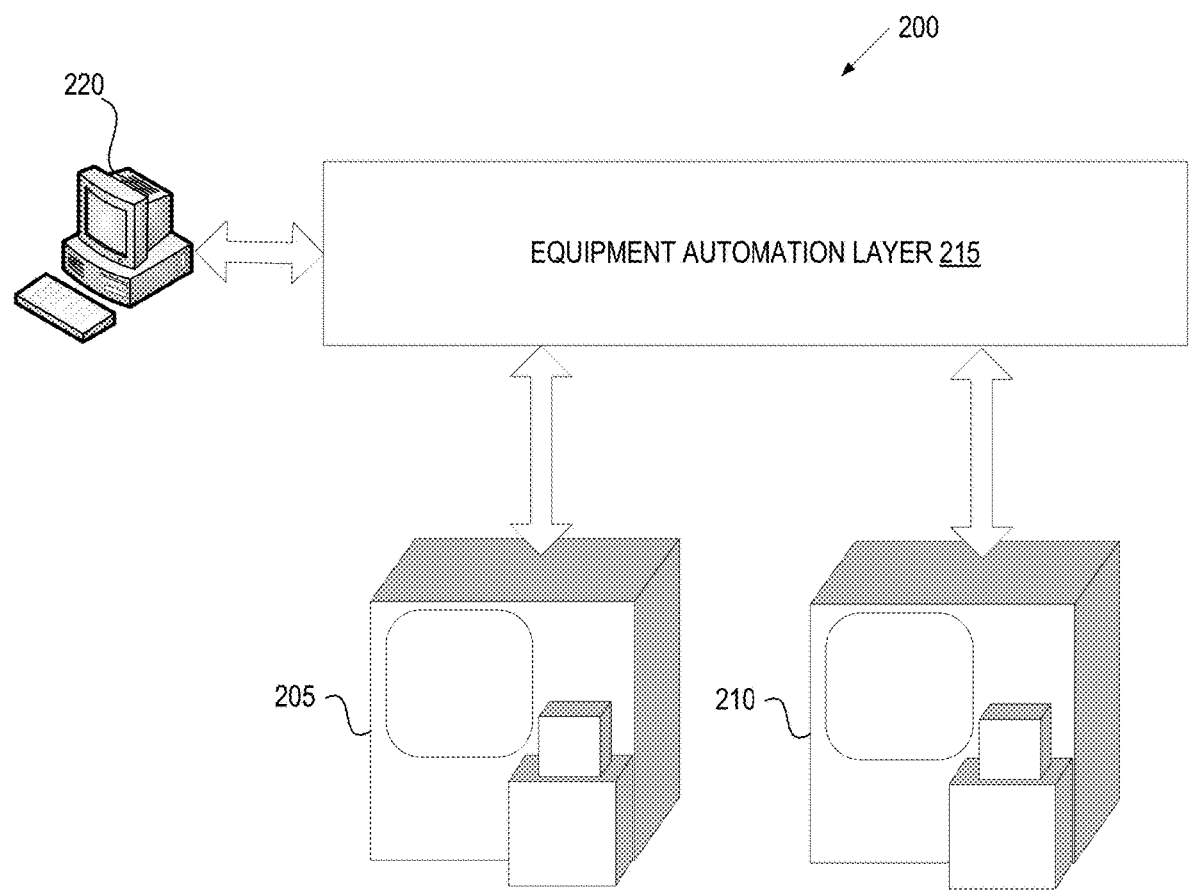
FIG. 2 illustrates an exemplary architecture of a manufacturing system, in accordance with one embodiment.

FIG. 2 illustrates an example architecture of a manufacturing system 200. The manufacturing system 200 may be a manufacturing system for thermal cycling and cleaning ceramic coatings on articles. In an embodiment, the manufacturing system 200 includes a furnace 205 (e.g., a ceramic furnace such as a kiln or a thermal reactor), a wet cleaner 210, an equipment automation layer 215 and a computing device 220. In alternative embodiments, the manufacturing system 200 may include more or fewer components. For example, the manufacturing system 200 may include the furnace 205 and the wet cleaner 210, which may be a manual off-line machine.

Furnace 205 is a machine designed to heat articles such as metal or ceramic articles. Furnace 205 includes a thermally insulated chamber, or oven, capable of applying a controlled temperature on articles (e.g., ceramic articles) inserted therein. In an embodiment, the chamber is hermitically sealed. Furnace 205 may include a pump to pump air out of the chamber, and thus to create a vacuum within the chamber. Furnace 205 may additionally or alternatively include a gas inlet to pump gasses (e.g., inert gasses such as Ar or $N_2$) into the chamber.

Furnace 205 may be a manual furnace having a temperature controller that is manually set by a technician during processing of ceramic articles. Furnace 205 may also be an off-line machine that can be programmed with a process recipe. The process recipe may control ramp up rates, ramp down rates, process times, temperatures, pressure, gas flows, and so on. Alternatively, furnace 205 may be an on-line automated furnace that can receive process recipes from computing devices 220 such as personal computers, server machines, etc. via an equipment automation layer 215. The equipment automation layer 215 may interconnect the furnace 205 with computing devices 220, with other manufacturing machines, with metrology tools and/or other devices.

Wet cleaner 210 is a cleaning apparatus that cleans new and/or used articles using a wet clean process. The wet cleaner 210 includes a wet bath filled with liquid, in which an article is immersed to clean the article. The wet cleaner 210 may agitate the wet bath using ultrasonic waves during cleaning to improve a cleaning efficacy. This is referred to herein as sonicating or ultrasonicating the wet bath. In an embodiment, the wet cleaner 210 includes a bath of deionized (DI) water.

The equipment automation layer 215 may include a network (e.g., a location area network (LAN)), routers, gateways, servers, data stores, and so on. The furnace 205 and the wet cleaner 210 may connect to the equipment automation layer 215 via a SEMI Equipment Communications Standard/Generic Equipment Model (SECS/GEM) interface, via an Ethernet interface, and/or via other interfaces. In an embodiment, the equipment automation layer 215 enables process data (e.g., data collected by furnace 205 during a process run) to be stored in a data store (not shown). In an alternative embodiment, the computing device 220 connects directly to the furnace 205 and/or the wet cleaner 210.

In an embodiment, the furnace 205 and/or the wet cleaner 210 includes a programmable controller that can load, store and execute process recipes. The programmable controller may control temperature settings, AC currents, energy settings, gas and/or vacuum settings, time settings, etc. of heat treatment processes. The programmable controller may control a heat up, may enable temperature to be ramped down as well as ramped up, may enable multi-step heat treating to be input as a single process, and so forth. The programmable controller may include a main memory (e.g., read-only memory (ROM), flash memory, dynamic random access memory (DRAM), static random access memory (SRAM), etc.), and/or a secondary memory (e.g., a data storage device such as a disk drive). The main memory and/or secondary memory may store instructions for performing heat treatment processes described herein.

The programmable controller may also include a processing device coupled to the main memory and/or secondary memory (e.g., via a bus) to execute the instructions. The processing device may be a general-purpose processing device such as a microprocessor, central processing unit, or the like. The processing device may also be a special-purpose processing device such as an application specific integrated circuit (ASIC), a field programmable gate array (FPGA), a digital signal processor (DSP), network processor, or the like. In an embodiment, programmable controller is a programmable logic controller (PLC).

In an embodiment, the furnace 205 and the wet cleaner 210 are programmed to execute a recipe that will cause the furnace 205 and the wet cleaner 210 to heat treat and clean an article with a ceramic coating using a thermal cycling process described with reference to FIGS. 3A and 3B.

Figure 3A:
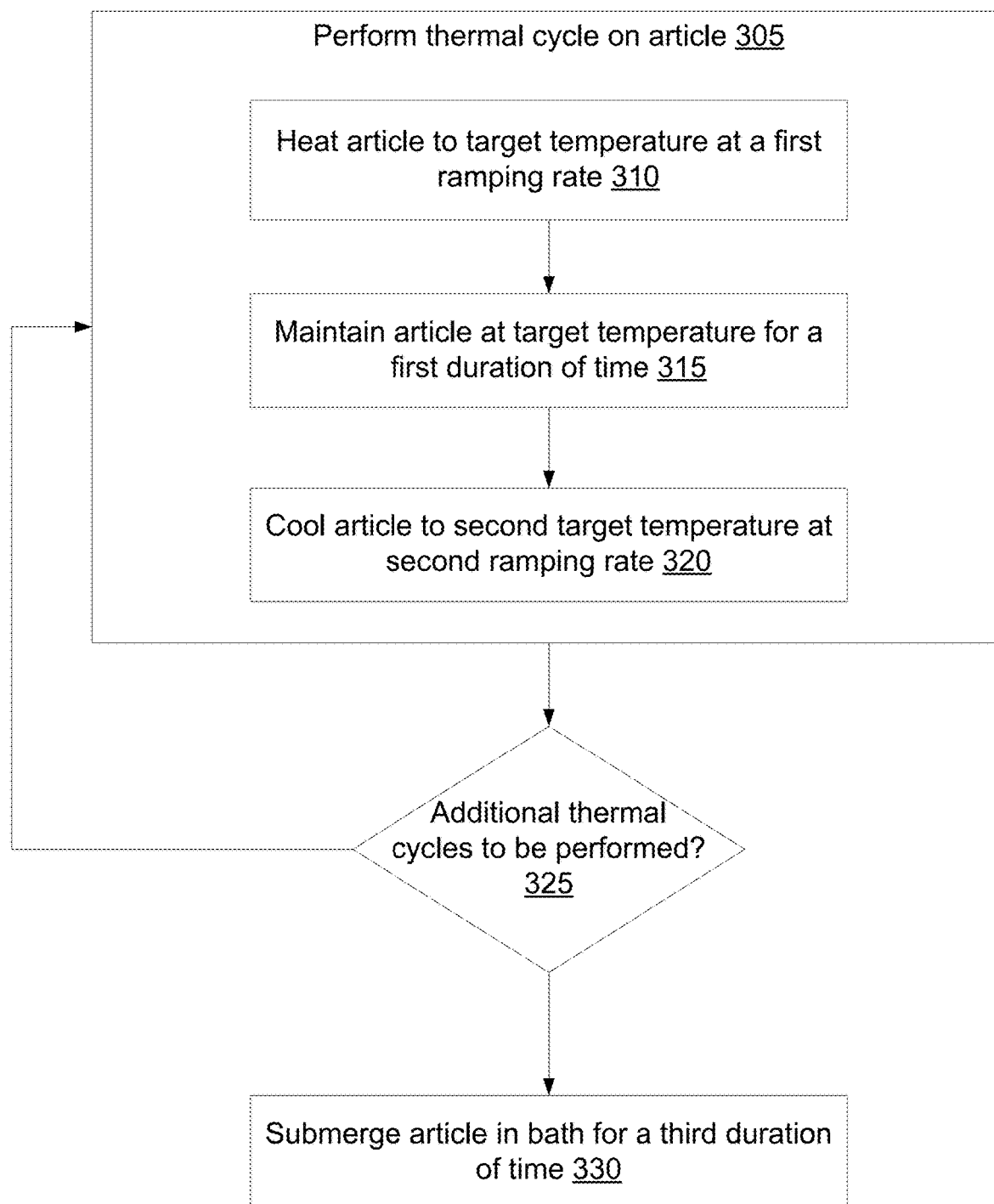
FIG. 3A and FIG. 3B illustrate methods of thermal cycle heat treatment and cleaning of an article according to embodiments.
Figure 3B:
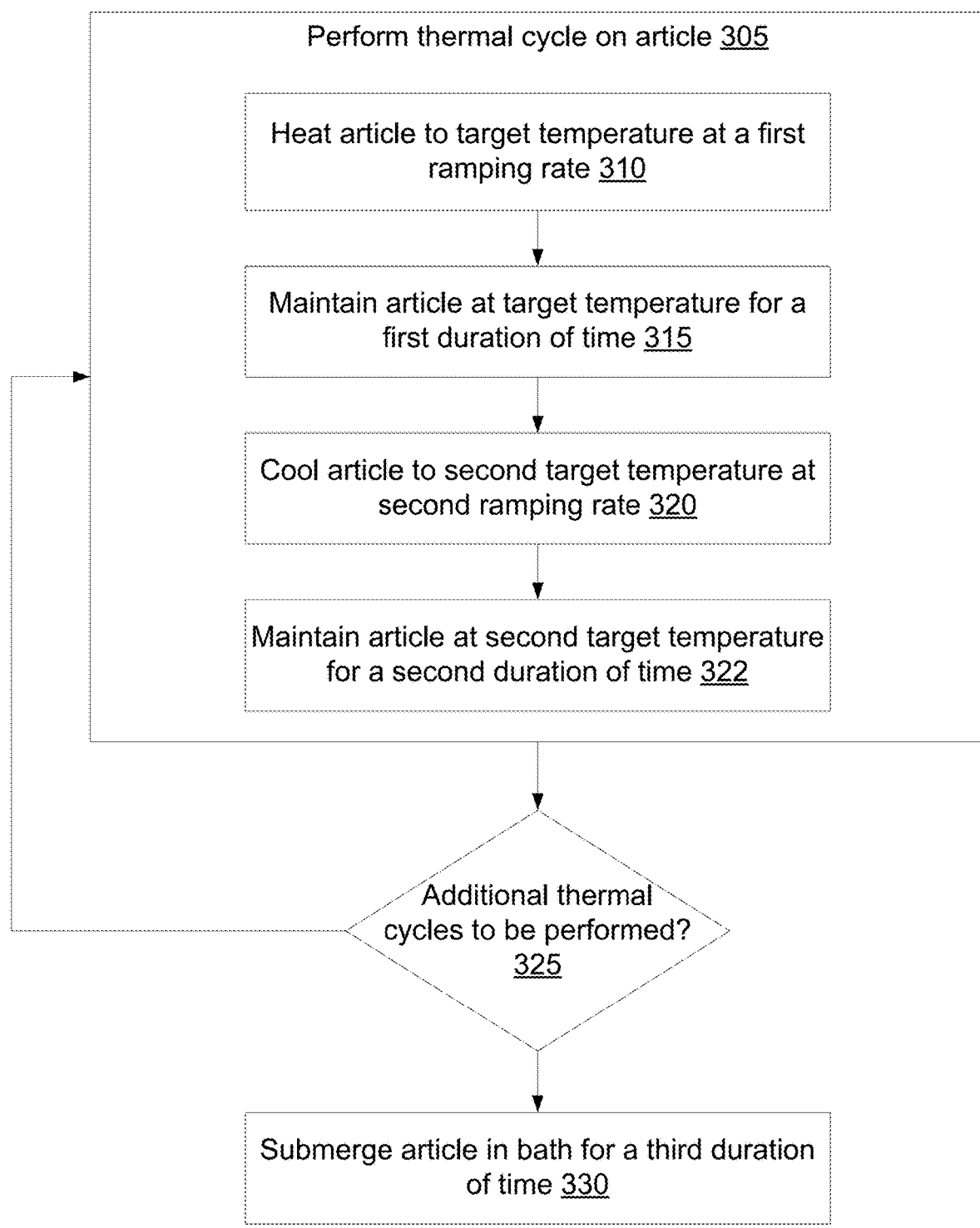

FIGS. 3A and 3B illustrate process 300 and process 302, respectively, for heat treating and cleaning an article with a ceramic coating using the furnace 205 and the wet cleaner 210, in accordance with embodiments. In an embodiment, the body of the article may be aluminum, an aluminum alloy (e.g., Al 6061, Al 6063, etc.), stainless steel, any other metal compound, or any ceramic compound described above.

In an embodiment, the ceramic coating may be machined. Examples of machining include surface grinding, polishing, drilling, abrading, cutting, bead blasting, or otherwise processing with machine tools. In an embodiment, after the ceramic coating is formed over the body, the ceramic coating is polished. This may cause a large amount of particles, which may be trapped in cracks, pores and other surface defects of the ceramic coating.

Pores, cracks, voids and other surface defects in the ceramic coating may include broken (or open) bonds that are high energy locations. These surface defects may trap particles. For example, the particles may form weak broken bonds with the ceramic article at the surface defect. During a plasma treatment, the plasma may break these weak broken bonds, and remove some of the particles from the ceramic coating. The ceramic particles may then be deposited on a processed substrate. Moreover, the plasma may break weak bonds of the ceramic article at the defect sites, at the pores, at the cracking, etc., which may erode the ceramic coating and cause additional particles to be created.

At block 305, the article with the ceramic coating is loaded into the furnace 205 and the furnace 205 performs a thermal cycle. In an embodiment, the thermal cycle includes heating the article to a target temperature at a first ramping rate, maintaining the article at the target temperature for a first duration of time, and cooling the article to a second target temperature at a second ramping rate. The individual steps of heating, maintaining, and cooling the article are described in blocks 310-322.

At block 310, the furnace 205 heats the article to the target temperature at the first ramping rate. In an embodiment, the target temperature may be between a range of 100° C. to 180° C. For example, if the body of the article is made up of aluminum or an aluminum mix then the furnace 205 may heat the article to a target temperature of 150° C. If the body of the article is a ceramic compound or another metal, then the furnace 205 may heat of a different target temperature within the range of 100° C. to 180° C.

In an embodiment, the furnace 205 may heat the article at a ramping rate between a range of about 3° C. to 10° C. per minute. The ramping rate may be based upon the composition of the body and the ceramic coating. Ceramic articles may be fragile, and may crack when exposed to extreme changes in temperature. Articles that have a metal body compound, such as stainless steel, may be able to handle higher ramping rates. Therefore a ramping rate that is slow enough to prevent cracking is desired. Ramping rates may also be based upon the ceramic coating compound. For example, $Al_2O_3$ may be heated at a rate of 10° C. per minute or more without cracking. However, $Y_2O_3$ may crack if heated at a ramping rate that is faster than about 5° C. per minute. In an embodiment, a ramping rate of about 3-5° C. per minute may be used. Typically, the article will start at or near ambient temperature, and will slowly be heated at the ramping rate to a predetermined temperature.

In an embodiment, the furnace 205 may use a thermal couple attached to an uncoated portion of the body of the article in order to determine when the target temperature has been reached. By using a thermal couple attached to the body of the article, the furnace 205 is able to ensure that the article is accurately heated to the target temperature before maintaining the target temperature. In another embodiment, the furnace 205 may use one or more calibrated temperature dots attached to the body of the article to determine when the target temperature is reached. Temperature dots or thermal indicators are adhesive devices that may be attached to the body of the article and are specifically calibrated to indicate when a target temperature is reached. For example, a 150° C. temperature dot may be attached to the body of the article and may indicate when the body of the article reaches the 150° C. Other temperature measurement techniques may also be used to detect the temperature of the article.

At block 315, the furnace 205 maintains the article at the target temperature for a first duration of time. In an embodiment, the first duration of time may be between a range of 5 minutes to 20 minutes (e.g., about 10 minutes). By maintaining the target temperature for the first duration of time, the furnace 205 ensures that the entire article is sufficiently heated to the target temperature. For example, the target temperature may be reached and indicated by either the thermal couple or the temperature dot. However, the thermal couple or temperature dot indicates the temperature that the point on the body where the thermal couple or temperature dot is attached. There may be instances where portions of the body of the article may not have reached the target temperature. By maintaining the target temperature for the duration, as defined by the first duration of time, the entire article may be heated to the target temperature. The first duration of time may be based on the composition of the body of the article, the composition of the ceramic coating, and/or the size and shape of the article itself.

At block 320, the furnace 205 cools the article to a second target temperature at a second ramping rate. In an embodiment, the second target temperature may be defined as room temperature, for instance a range between 24° C. and 27° C., or any other desired temperature. In an embodiment, the second ramping rate may be within a range of about 2° C. and 10° C. per minute. As discussed with the first ramping rate, the second ramping rate may be based on the composition of the body of the article and/or the ceramic coating of the article.

FIG. 3B illustrates process 302 where the article, after being cooled to the second target temperature is maintained at the second target temperature for a second duration of time. At block 322, the furnace 205 maintains the article at a second target temperature for a second duration of time. In an embodiment, the furnace 205 may maintain the second target temperature for a duration of time based upon the composition of the body of the article, the composition of the ceramic coating, and the size and shape of the article itself. The second duration of time may be one or a few seconds up to about 20 minutes. For example, the furnace 205 may end the thermal cycle once the second target temperature is reached or the furnace 205 may maintain the second target temperature for a configured duration of time before ending the current thermal cycle.

Referring to both FIG. 3A and FIG. 3B, the process of heating and then cooling the article, as described in blocks 310-322, cause the particles of the ceramic coating to expand during the heating phase and contract during the cooling phase. The expansion and contraction of the ceramic coating particles cause the partially bonded particles in areas, such as crevices and peaks, to weaken and break. In an embodiment, weakening and breaking bonds for partially bonded particles may be achieved with several thermal cycles (e.g., several cycles of heating and cooling).

At decision diamond 325, the furnace 205 determines whether additional thermal cycles are to be performed. In an embodiment, the computing device 220 determines that an additional thermal cycle is to be performed and instructs the furnace 205 to initiate an additional thermal cycle. If an additional thermal cycle is initiated, then the furnace 205 repeats blocks 310-320 to heat and cool the article. If, however, the computing device 220 determines that the target number of thermal cycles has been performed, then the computing device 220 proceeds to block 330 where the wet cleaner 210 cleans the article. The target number of thermal cycles may be based upon the composition of the body of the article, the shape of the article, the type and number of crevices present on the article, a porosity of the article, a roughness of the article, and/or the composition of the ceramic coating. For example, an Aluminum-bodied article with plasma sprayed ceramic coating may be thermal cycled five times before proceeding to cleaning at block 330.

At block 330, the wet cleaner 210 cleans the article by submerging the article in a solution bath for a third duration of time in order to remove the loose particles created from the thermal cycle. In an embodiment, the third duration of time for submerging the article may be between a range of 5 minutes to 120 minutes (e.g., about 15 minutes). In an embodiment, the article is submerged in a bath of deionized (DI) water. The temperature of the DI water may be between room temperature and about 70° C. In other embodiments, the solution bath may contain other solutions other than DI water, such as an acidic solution or a basic solution.

In an embodiment, during the third duration of time that the article is submerged in the solution bath, the wet cleaner 210 may ultrasonicate the solution bath at a frequency for the duration of time. The ultrasonication may be performed at a power of 10-50 Watt/inch$^2$ with a frequency between 40-60 kHz in one embodiment. In an embodiment, the wet cleaner 210 may ultrasonicate the solution bath at a frequency between 100-120 kHz for the duration of time that the article is submerged in the bath using the power of 10-50 Watt/inch$^2$ or a different power.

In an embodiment, the wet cleaner 210 may be instructed to alternate ultrasonication frequencies between a first frequency and a second frequency for the third duration of time that the article is in the bath. For example, after the article is submerged in the bath, the wet cleaner 210 may ultrasonicate the bath at a first frequency between 40-60 kHz for 5 minutes and then the wet cleaner 210 may ultrasonicate the bath at a second frequency between 100-140 kHz for another 5 minutes. The wet cleaner 210 may then alternate between the first and second frequencies for the third duration of time that the article is submerged in the bath. The duration of time for each alternating frequency may be customized depending upon the article size, shape, and composition, the ceramic coating composition, the composition of the solution and the temperature of the solution in the bath, and/or any other configurable factor.

FIG. 4 illustrates advantages of performing multiple thermal cycles prior to cleaning an article, in accordance with embodiments described herein. Table 400 is a liquid particle count table of loose particles measured from test samples that were either cleaned by the wet cleaner 210 or heat treated in the furnace 205 and then cleaned by the wet cleaner 210. Referring to table 400, legend 405 indicates that sample 821 represents an article that was cleaned using the wet cleaner 210 in a DI water bath and ultrasonicated. Sample 822 represents an article that was heat treated by multiple thermal cycles in the furnace 205 and then cleaned using the wet cleaner 210 in the DI water bath and ultrasonicated. Table 400 contains 5 rows of liquid particle count measurements representing different particle sizes ranging from greater than or equal to 0.2 µm, 0.3 µm, 0.5 µm, 1.0 µm, and 2.0 µm. Columns in table 400 indicate liquid particle counts measured from samples 821 and 822 before and after the cleaning processes. For example, sample 821 had a measured liquid particle count of 3,600,000 particles sized greater than or equal to 0.2 µm prior to cleaning. After cleaning, which included simply cleaning by the wet cleaner 210, sample 821 had a measured liquid particle count of 110,000 particles sized greater than or equal to 0.2 µm. The fifth column of table 400 shows that sample 821 had a 96.94% decrease in loose particle count after cleaning in the wet cleaner 210.

Sample 822 represents the tested article that was heat treated using thermal cycling in the furnace 205 prior to cleaning using the wet cleaner 210, according to embodiments described herein. Sample 822 had a measured liquid particle count of 5,200,000 particles sized greater than or equal to 0.2 µm prior to cleaning. After heat treatment using multiple thermal cycling operations in the furnace 205 and cleaning by the wet cleaner 210, sample 822 had a measured liquid particle count of 7,500 particles sized greater than or equal to 0.2 µm. The sixth column of table 400 shows that sample 822 had a 99.86% decrease in loose particle count after thermal cycling in the furnace 205 and cleaning in the wet cleaner 210. The results illustrated in table 400 indicate that the thermal cycling described in FIG. 3 resulted in more efficient removal of particles from the ceramic coating of the article than cleaning the article in the wet cleaner 210 without thermal cycling. For each of the particle sizes measured by the liquid particle count measurements, thermal cycling plus cleaning resulted in a decrease of above 99% of loose particles from the ceramic coating of the article.

The preceding description sets forth numerous specific details such as examples of specific systems, components, methods, and so forth, in order to provide a good understanding of several embodiments. It will be apparent to one skilled in the art, however, that at least some embodiments may be practiced without these specific details. In other instances, well-known components or methods are not described in detail or are presented in simple block diagram format in order to avoid unnecessarily obscuring the embodiments. Thus, the specific details set forth are merely exemplary. Particular implementations may vary from these exemplary details and still be contemplated to be within the scope of the present embodiments.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or."

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of embodiments should, therefore, be determined with reference to the appended claims, along with the full scope of equivalents to which such claims are entitled.

What is claimed is:

1. A method comprising:
   performing two or more successive thermal cycles on a ceramic article comprising a body and a ceramic coating on at least one surface of the body, wherein the two or more successive thermal cycles expand and contract the ceramic coating to weaken bonds of particles to the ceramic coating, and wherein each successive thermal cycle of the two or more successive thermal cycles comprises:
   heating the ceramic article to a first target temperature of about 100° C. to about 150° C. at a first ramping rate;
   maintaining the ceramic article at the first target temperature for a first duration of time; and
   cooling the ceramic article to a second target temperature at a second ramping rate; and
   responsive to performing the two or more successive thermal cycles, submerging the ceramic article in a bath for a second duration of time to remove the particles from the ceramic coating.

2. The method of claim 1, wherein the ceramic coating consists essentially of at least one of $Y_2O_3$, $Al_2O_3$, $Er_2O_3$, $Gd_2O_3$, $YF_3$, $Nd_2O_3$, $Er_4Al_2O_9$, $Er_3A_{15}O_{12}$, $ErAlO_3$, $Gd_4A_{12}O_9$, $GdAlO_3$, $Nd_3A_{15}O_{12}$, $Nd_4A_{12}O_9$, $NdAlO_3$, $YAlO_3$, $Y_4Al_2O_9$, $Y_3A_{15}O_{12}$ (YAG), a solid solution of $Y_2O_3$—$ZrO_2$, a ceramic compound comprising $Y_4Al_2O_9$ and a solid-solution of $Y_2O_3$—$ZrO_2$, or a ceramic compound comprising $Y_2O_3$, $Er_2O_3$, $ZrO_2$, $Gd_2O_3$ and $SiO_2$.

3. The method of claim 1, wherein the first ramping rate is about 3° C. per minute to about 10° C. per minute.

4. The method of claim 1, wherein the second target temperature is about 24° C. to 27° C.

5. The method of claim 1, wherein the second ramping rate is about 2° C. per minute to about 10° C. per minute.

6. The method of claim 1, wherein the bath is a bath of deionized water, and wherein submerging the ceramic article in the bath of deionized water for the second duration of time comprises ultrasonicating the ceramic article at a frequency of about 40 kHz to about 60 kHz for the second duration of time.

7. The method of claim 1, wherein the ceramic article is a chamber component for a processing chamber.

8. A method comprising:
   performing two or more thermal cycles on a ceramic article comprising a body and a ceramic coating on at least one surface of the body, wherein the two or more thermal cycles expand and contract the ceramic coating to weaken bonds of particles to the ceramic coating, and wherein each thermal cycle of the two or more thermal cycles comprises:
   heating the ceramic article to a target temperature of about 100° C. to about 150° C. at a first ramping rate of about 3° C. per minute to about 10° C. per minute;
   maintaining the ceramic article at the target temperature for a first duration of time of about 5 minutes to about 20 minutes;
   cooling the ceramic article to a second target temperature of about 24° C. to 27° C. at a second ramping rate of about 2° C. per minute to about 10° C. per minute; and
   maintaining the ceramic article at the second target temperature for a second duration of time of about 2 seconds to about 20 minutes; and
   submerging the ceramic article in a bath for a third duration of time to remove the particles from the ceramic coating.

9. A method comprising:
   performing two or more thermal cycles on a ceramic article comprising a body and a ceramic coating on at least one surface of the body, wherein the two or more thermal cycles expand and contract the ceramic coating to weaken bonds of particles to the ceramic coating, and wherein each thermal cycle of the two or more thermal cycles comprises:

heating the ceramic article to a first target temperature of about 100° C. to about 150° C. at a first ramping rate;

maintaining the ceramic article at the first target temperature for a first duration of time, wherein the first duration of time is about 5 minutes to about 20 minutes; and cooling the ceramic article to a second target temperature at a second ramping rate; and submerging the ceramic article in a bath for a second duration of time to remove the particles from the ceramic coating.

10. The method of claim 9, wherein the ceramic coating consists essentially of at least one of $Y_2O_3$, $Al_2O_3$, $Er_2O_3$, $Gd_2O_3$, $YF_3$, $Nd_2O_3$, $Er_4A_{12}O_9$, $Er_3A_{15}O_{12}$, $ErAlO_3$, $Gd_4A_{12}O_9$, $GdAlO_3$, $Nd_3A_{15}O_{12}$, $Nd_4A_{12}O_9$, $NdAlO_3$, $YAlO_3$, $Y_4Al_2O_9$, $Y_3A_{15}O_{12}$ (YAG), a solid solution of $Y_2O_3$—$ZrO_2$, a ceramic compound comprising $Y_4Al_2O_9$ and a solid-solution of $Y_2O_3$—$ZrO_2$, or a ceramic compound comprising $Y_2O_3$, $Er_2O_3$, $ZrO_2$, $Gd_2O_3$ and $SiO_2$.

11. The method of claim 9, wherein the first ramping rate is about 3° C. per minute to about 10° C. per minute.

12. The method of claim 9, wherein the second ramping rate is about 2° C. per minute to about 10° C. per minute.

13. The method of claim 9, The method of claim 1, wherein the second target temperature is about 24° C. to about 27° C.

14. The method of claim 9, wherein the bath is a bath of deionized water, and wherein submerging the ceramic article in the bath of deionized water for the second duration of time comprises ultrasonicating the ceramic article at a frequency of about 40 kHz to about 60 kHz for the second duration of time.

15. The method of claim 9, wherein the ceramic article is a chamber component for a processing chamber.

16. The method of claim 9, wherein the two or more thermal cycles are consecutive thermal cycles.

17. A method comprising:

performing two or more thermal cycles on a ceramic article comprising a body and a ceramic coating on at least one surface of the body, wherein the two or more thermal cycles expand and contract the ceramic coating to weaken bonds of particles to the ceramic coating, and wherein each thermal cycle of the two or more thermal cycles comprises:

heating the ceramic article to a first target temperature of about 100° C. to about 150° C. at a first ramping rate;

maintaining the ceramic article at the first target temperature for a first duration of time; and cooling the ceramic article to a second target temperature at a second ramping rate; and submerging the ceramic article in a bath for a second duration of time to remove the particles from the ceramic coating, wherein the bath is a bath of deionized water, and wherein submerging the ceramic article in the bath of deionized water for the second duration of time comprises alternating between ultrasonicating the ceramic article at a first frequency of about 40 kHz to about 60 kHz for a third duration of time and ultrasonicating the ceramic article at a second frequency of about 100 kHz to about 140 kHz for a fourth duration of time.

18. The method of claim 17, wherein the first ramping rate is about 3° C. per minute to about 10° C. per minute and the second ramping rate is about 2° C. per minute to about 10° C. per minute.

19. The method of claim 17, wherein the second target temperature is about 24° C. to about 27° C.

20. The method of claim 17, wherein the ceramic coating consists essentially of at least one of $Y_2O_3$, $Al_2O_3$, $Er_2O_3$, $Gd_2O_3$, $YF_3$, $Nd_2O_3$, $Er_4A_{12}O_9$, $Er_3A_{15}O_{12}$, $ErAlO_3$, $Gd_4A_{12}O_9$, $GdAlO_3$, $Nd_3A_{15}O_{12}$, $Nd_4A_{12}O_9$, $NdAlO_3$, $YAlO_3$, $Y_4Al_2O_9$, $Y_3A_{15}O_{12}$ (YAG), a solid solution of $Y_2O_3$—$ZrO_2$, a ceramic compound comprising $Y_4A_{12}O_9$ and a solid-solution of $Y_2O_3$—$ZrO_2$, or a ceramic compound comprising $Y_2O_3$, $Er_2O_3$, $ZrO_2$, $Gd_2O_3$ and $SiO_2$.

\* \* \* \* \*

UNITED STATES PATENT AND TRADEMARK OFFICE
CERTIFICATE OF CORRECTION

PATENT NO. : 10,766,824 B2  
APPLICATION NO. : 15/807508  
DATED : September 8, 2020  
INVENTOR(S) : Kaushal Gangakhedkar, Jennifer Y. Sun and Xiao-Ming He Page 1 of 2

It is certified that error appears in the above-identified patent and that said Letters Patent is hereby corrected as shown below:

In the Claims

In Claim 2, Column 12, Line 14, after "$Er_4Al_2O_9$" delete "$Er_3A_{15}O_{12}$" and insert --$Er_3Al_5O_{12}$--

In Claim 2, Column 12, Line 15, before "$GdAlO_3$" delete "$Gd_4A_{12}O_9$" and insert --$Gd_4Al_2O_9$--

In Claim 2, Column 12, Line 15, after "$GdAlO_3$" delete "$Nd_3A_{15}0_{12}, Nd_4A_{12}0_9$" and insert --$Nd_3Al_5O_{12}, Nd_4Al_2O_9$--

In Claim 2, Column 12, Line 16, after "$Y_4Al_2 0_9$" delete "$Y_3A_{15}0_{12}$" and insert --$Y_3Al_5O_{12}$--

In Claim 10, Column 13, Line 15, after "$Nd_2O_3$" delete "$Er_4A_{12}O_9, Er_3A_{15}O_{12}$" and insert --$Er_4Al_2O_9, Er_3Al_5O_{12}$--

In Claim 10, Column 13, Line 15, before "$GdAlO_3$" delete "$Gd_4A_{12}O_9$" and insert --$Gd_4Al_{12}O_9$--

In Claim 10, Column 13, Line 16, after "$GdAlO_3$" delete "$Nd_3A_{15}O_{12}, Nd_4A_{12}O_9$" and insert --$Nd_3Al_5O_{12}, Nd_4Al_2O_9$--

In Claim 10, Column 13, Line 17, after "$Y_4Al_2O_9$" delete "$Y_3A_{15}O_{12}$" and insert --$Y_3Al_5O_{12}$--

In Claim 20, Column 14, Line 33, after "$Nd_2O_3$" delete "$Er_4A_{12}O_9, Er_3A_{15}O_{12}$" and insert --$Er_4Al_2O_9, Er_3Al_5O_{12}$--

In Claim 20, Column 14, Line 34, after "$GdAlO_3$" delete "$Nd_3A_{15}0_{12}, Nd_4A_{12}0_9$" and insert --$Nd_3Al_5O_{12}, Nd_4Al_2O_9$--

In Claim 20, Column 14, Line 34, before "$GdAlO_3$" delete "$Gd_4A_{12}O_9$" and insert --$Gd_4Al_{12}O_9$--

Signed and Sealed this  
Twenty-third Day of March, 2021

Drew Hirshfeld  
*Performing the Functions and Duties of the*  
*Under Secretary of Commerce for Intellectual Property and*  
*Director of the United States Patent and Trademark Office*

CERTIFICATE OF CORRECTION (continued)
U.S. Pat. No. 10,766,824 B2

In Claim 20, Column 14, Line 35, after "$YAlO_3$" delete "$Y_4A_{12}O_9$ , $Y_3A_{15}O_{12}$" and insert --$Y_4Al_2O_9$, $Y_3Al_5O_{12}$--

In Claim 20, Column 14, Line 36, after "comprising" delete "$Y_4A_{12}O_9$" and insert --$Y_4Al_2O_9$--